United States Patent
Lau

(10) Patent No.: US 7,106,049 B2
(45) Date of Patent: Sep. 12, 2006

(54) ZERO-TEMPERATURE-GRADIENT ZERO-BIAS THERMALLY STIMULATED CURRENT TECHNIQUE TO CHARACTERIZE DEFECTS IN SEMICONDUCTORS OR INSULATORS

(75) Inventor: Wai Shing Lau, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 11/083,187

(22) Filed: Mar. 17, 2005

(65) Prior Publication Data
US 2005/0162153 A1 Jul. 28, 2005

Related U.S. Application Data

(62) Division of application No. 09/563,833, filed on May 5, 2000, now Pat. No. 6,909,273.

(51) Int. Cl.
*G01R 31/26* (2006.01)
*F25B 19/00* (2006.01)

(52) U.S. Cl. .................... 324/158.1; 324/765
(58) Field of Classification Search ............ None
See application file for complete search history.

(56) References Cited

U.S. PATENT DOCUMENTS

| | | | |
|---|---|---|---|
| 4,496,642 A | 1/1985 | Tam et al. | 430/41 |
| 4,839,588 A | 6/1989 | Jantsch et al. | 324/158 D |
| 5,047,713 A * | 9/1991 | Kirino et al. | 324/752 |
| 5,182,852 A * | 2/1993 | Montanari | 29/840 |
| 5,207,069 A * | 5/1993 | Matsuda et al. | 62/55.5 |
| 5,360,267 A | 11/1994 | Ibar | 374/45 |
| 5,867,034 A * | 2/1999 | Sokolov et al. | 324/765 |
| 2003/0087508 A1 * | 5/2003 | Fujiwara et al. | 438/466 |

OTHER PUBLICATIONS

"Thermal Diagnostics of High Power Electrical and Optical Device Time to Failure," by Dawson et al. University of Toronto, Canada, 1993, pp. 1248-1255.*

"A temperature-controlled cryostat for optical, electrical and glow curve measurements between 77 and 800K", by A Katzir, Soreq Nuclear Research Center, Yavne, Israel, 1974, Apparatus and Techniques, pp. 421-423.*

(Continued)

*Primary Examiner*—Paresh Patel
(74) *Attorney, Agent, or Firm*—Saile Ackerman LLC; Stephen B. Ackerman; Rosemary L. S Pike

(57) ABSTRACT

A process for characterizing defects in semiconductors or insulators using a zero-bias thermally stimulated current technique wherein parasitic current is eliminated by the use of a novel ZBTSC apparatus that eliminates temperature gradient across a sample is described. The novel ZBTSC apparatus comprises a cold finger on a cyrostat. A sample holder is attached to the cold finger. A probe holder is attached to the cold finger. A probe is attached to the probe holder. A feedback temperature control keeps the probe and the cold finger at the same temperature. The improved zero-bias thermally stimulated current technique of the invention comprises mounting a sample on the sample holder of the novel ZBTSC apparatus. The sample is excited at a first temperature to fill up defect traps with carriers and then heated to a second temperature higher than the first temperature wherein the heating is a linear function with respect to time. Defects are characterized by measuring current due to emission of the carriers from the defect traps as a function of temperature wherein the measuring is performed by the probe of the novel ZBTSC apparatus.

13 Claims, 2 Drawing Sheets

OTHER PUBLICATIONS

Lau et al., "Detection of defect states responsible for leakage current in ultrathin tantalum pentoxide ($Ta_2O_5$) films by zero-bias thermally stimulated current spectroscopy", Appl. Phys. Lett.(4), Jul. 28, 1997, pp. 500-502.

Busta et al., "Design of High-Vacuum Test Station for Rapid Evaluation of Vacuum Microelectronic Devices", IEEE Trans. on Electron Devices, vol. 38, Oct. 10, 1991, pp. 2350-2354.

* cited by examiner

ZERO-TEMPERATURE-GRADIENT ZERO-BIAS THERMALLY STIMULATED CURRENT TECHNIQUE TO CHARACTERIZE DEFECTS IN SEMICONDUCTORS OR INSULATORS

This is a division of patent application Ser. No. 09/563,833 filing date May 5, 2000 U.S. Pat. No. 6,909,273, ZERO-TEMPERATURE GRADIENT ZERO-BIAS THERMALLY STIMULATED CURRENT TECHNIQUE TO CHARACTERIZE DEFECTS IN SEMICONDUCTORS OR INSULATORS, assigned to the same assignee as the present invention, which is herein incorporated by reference in its entirety.

BACKGROUND OF THE INVENTION (1) Field of the Invention

The present invention relates to an improved method of characterizing defects in semiconductors or insulators.

(2) Description of the Prior Art

Thermally stimulated current (TSC) is a well known method for the characterization of defects in semiconductors or insulators. A sample is excited either optically or electrically to fill up the defect states or traps with carriers at a low temperature, e.g. the temperature of liquid nitrogen. Then the sample is heated with the temperature increasing linearly with time. A current due to carriers being emitted from the filled defects or traps is then recorded as a function of temperature.

Usually, a bias voltage is needed as the driving force for emitting carriers during TSC measurement. However, a parasitic current which originates from the bias voltage and increases exponentially with temperature can cover up the TSC signal, especially for energetically deep defects in the band gap. Zero-bias thermally stimulated current (ZBTSC) makes use of either a built-in potential or a temperature gradient as the driving force for carriers emitted during measurement. It has been found that a parasitic current still exists for ZBTSC due to a very small temperature gradient accidentally created in the sample during ZBTSC measurement. During ZBTSC measurement, a probe is needed to contact the device under test (DUT) which is placed on the cold finger of a cryostat. A cryostat is a piece of equipment used for lowering the temperature to, for example, the temperature of liquid nitrogen. There is a temperature difference between the probe holder and the sample holder, the so-called cold finger. The temperature of the cold finger can be lowered to, for example, the temperature of liquid nitrogen. This temperature difference can produce a small temperature gradient across the DUT, resulting in a parasitic current in the ZBTSC spectrum.

FIG. 1 graphically illustrates the TSC signal at increasing temperature during ZBTSC measurement. The TSC peaks 11 and 12 indicate defect states. 13 indicates the parasitic current due to the temperature gradient in the sample during temperature scan. The parasitic current 13 will mask the TSC peak 12.

The parasitic current during ZBTSC limits the range of ZBTSC to relatively energetically shallow defects. For example, the defects at low temperatures (11) may be found while defects at higher temperatures (12) will be masked by the parasitic current 13. Sometimes, the parasitic current can be the detection limit for even energetically shallow defects. It is desired to find a way to provide zero-temperature-gradient ZBTSC.

A number of patents discuss the TSC technique. U.S. Pat. No. 4,839,588 to Jantsch et al states that there is always a certain amount of leakage current present when TSC is reverse biased. This patent teaches a method of measuring change in a microwave field rather than the current measurement of TSC. U.S. Pat. No. 5,360,267 to Ibar discusses the use of TSC to measure relaxation of especially plastics and polymers. U.S. Pat. No. 4,496,642 to Tam et al shows a TSC method for measuring current as temperature is increased. No mention is made of leakage current or temperature gradient.

SUMMARY OF THE INVENTION

Accordingly, the primary object of the invention is to provide a process for characterizing defects in semiconductors or insulators using a zero-bias thermally stimulated current technique having a zero temperature. gradient wherein parasitic current is eliminated.

A further object of the invention is to provide a novel ZBTSC apparatus that eliminates temperature gradient across a sample.

Another object of the invention is to provide a process for characterizing defects in semiconductors or insulators using a zero-bias thermally stimulated current technique wherein parasitic current is eliminated by the use of a novel ZBTSC apparatus that eliminates temperature gradient across a sample.

In accordance with the objects of the invention, a process for characterizing defects in semiconductors or insulators using a zero-bias thermally stimulated current technique wherein parasitic current is eliminated by the use of a novel ZBTSC apparatus that eliminates temperature gradient across a sample is achieved. The novel ZBTSC apparatus comprises a cold finger on a cryostat. A sample holder is attached to the cold finger. A probe holder is attached to the cold finger. A probe is attached to the probe holder. A feedback temperature control keeps the probe and the cold finger at the same temperature. Alternatively, the sample holder may be attached to a first cold finger and the probe holder attached to a second cold finger. Feedback temperature controls for each cold finger are programed such that their temperatures are kept the same. The improved zero-bias thermally stimulated current technique of the invention comprises mounting a sample on the sample holder of the novel ZBTSC apparatus. The sample is excited at a first temperature to fill up defect traps with carriers and then heated to a second temperature higher than the first temperature wherein the heating is a linear function with respect to time. Defects are characterized by measuring current due to emission of the carriers from the defect traps as a function of temperature wherein the measuring is performed by the probe of the novel ZBTSC apparatus.

BRIEF DESCRIPTION OF THE DRAWINGS

In the accompanying drawings forming a material part of this description, there is shown.

DESCRIPTION OF THE PREFERRED EMBODIMENTS

The zero-temperature-gradient zero-bias thermally stimulated current (ZTGZBTSC) technique of the present invention is used to characterize defects in semiconductors or insulators. For example, a semiconductor device structure is fabricated to a particular point in the process and then is subjected to the ZTGZBTSC technique to characterize any defects that may have been formed within the device. This information is then used to modify process steps, as necessary.

Figure 5:
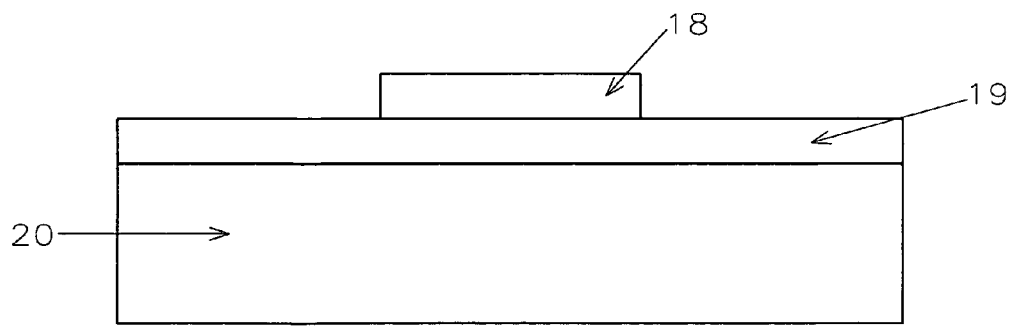
FIG. 5 is a cross-sectional representation of a possible sample used in the process of the present invention.

For example, a simple sample is illustrated in FIG. 5. A gate electrode 18, which can be metal or heavily doped semiconductor, is fabricated on top of a thin film of semiconductor or insulator 19. The film of semiconductor or insulator is on top of a conductor 20 which can be a metal or heavily doped semiconductor substrate.

It will be understood by those skilled in the art that the example give in FIG. 5 is illustrative only. The process of the invention can be used on any device structure comprising semiconductor or insulator elements.

Now the device in FIG. 5, for example, or any other semiconductor device, is to be subjected to the zero-bias thermally stimulated current technique of the present invention in order to characterize defects formed in the process of manufacture to this point.

The sample, such as the device shown in FIG. 5, is excited either optically or electrically to fill up the defect states or traps with carriers at a low temperature, e.g. the temperature of liquid nitrogen. Then the sample is heated with the temperature increasing linearly with time. A current due to carriers being emitted from the filled defects or traps is then recorded as a function of temperature. The zero-bias thermally stimulated current technique makes use of either a built-in potential or a temperature gradient as the driving force for carriers emitted during measurement.

Figure 1:
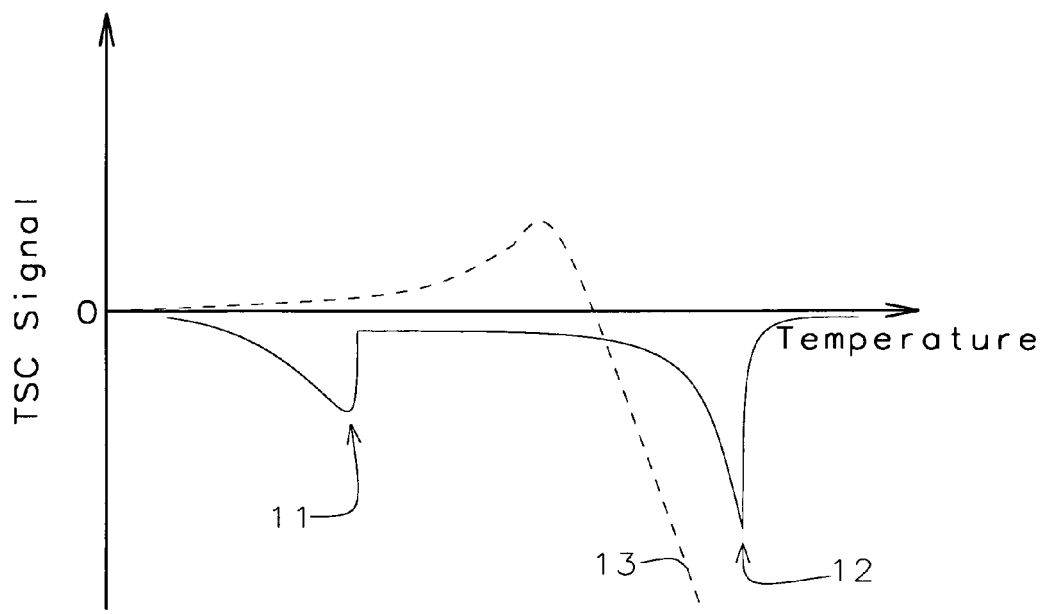
FIG. 1 is a graphical representation of a thermally stimulated current (TSC) signal at increasing temperatures during ZBTSC measurement showing parasitic current which occurs in the prior art.
Figure 2:
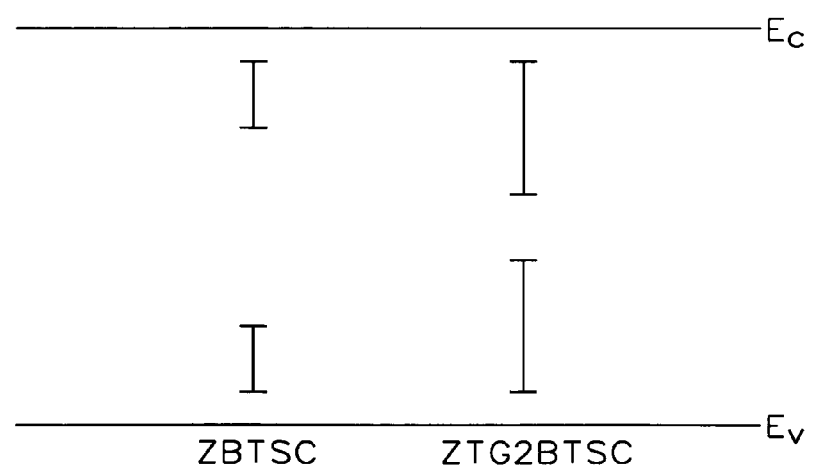
FIG. 2 is a graphical representation comparing the zero-bias thermally stimulated current (ZBTSC) technique of the prior art to the zero-temperature-gradient zero-bias thermally stimulated current (ZTGZBTSC) technique of the present invention.

The zero-temperature-gradient zero-bias thermally stimulated current (ZTGZBTSC) technique of the present invention will increase both the range and the detection limit of the basic ZBTSC technique. This can be seen graphically in FIG. 2. $E_c$ is the bottom of the conduction band and $E_v$ is the top of the valence band.

As explained above, the undesirable temperature gradient across the sample comes from the temperature difference between the probe holder and the cold finger. The probe holder is usually at a temperature of close to room temperature, whereas the cold finger is brought from, for example, the temperature of liquid nitrogen to a temperature above room temperature. The temperature difference between the probe holder and the cold finger can produce a temperature gradient across the sample. To solve this problem, the probe holder should have the same temperature as the cold finger. This new technique is called zero-temperature-gradient zero-bias thermally stimulated current (ZTGZBTSC) by the inventors.

Figure 3:
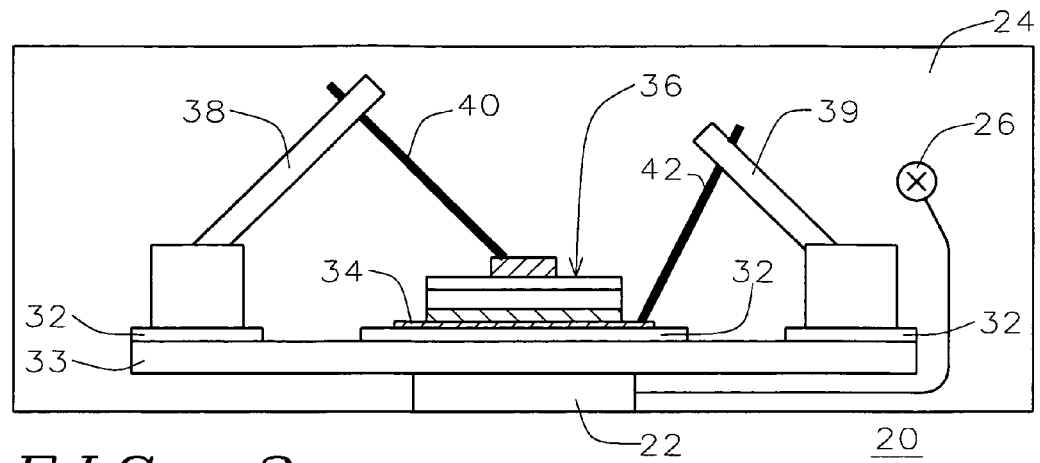
FIGS. 3 and 4 are cross-sectional representations of the novel ZBTSC apparatus of the present invention.

To realize the ZTGZBTSC technique of the present invention, two probe holders and the sample can be mounted on the same cold finger. One embodiment of the novel ZBTSC apparatus of the present invention is illustrated in FIG. 3. Cold finger 33 is shown. The cold finger, usually made of copper, is attached to the cooling element, heater, and temperature sensor 22 of the cryostat 20 inside a vacuum chamber 24. An insulator 32, such as mica, overlies the cold finger. The sample 36 is mounted onto the cold finger by means of a conductive adhesive 34, such as silver paint. The sample 36 in this figure is a simplified device. The sample may be any device comprising semiconductors or insulators, such as, but not limited to, the device illustrated in FIG. 5. Probe holders 38 and 39 are also mounted on the cold finger, e.g. by nylon screws. Probes 40 and 42 are used as top and bottom contacts, respectively. During the temperature scanning in ZBTSC measurement, there will be one set of feedback temperature controls 26 such that the two probes and the cold finger will have the same temperature.

Figure 4:
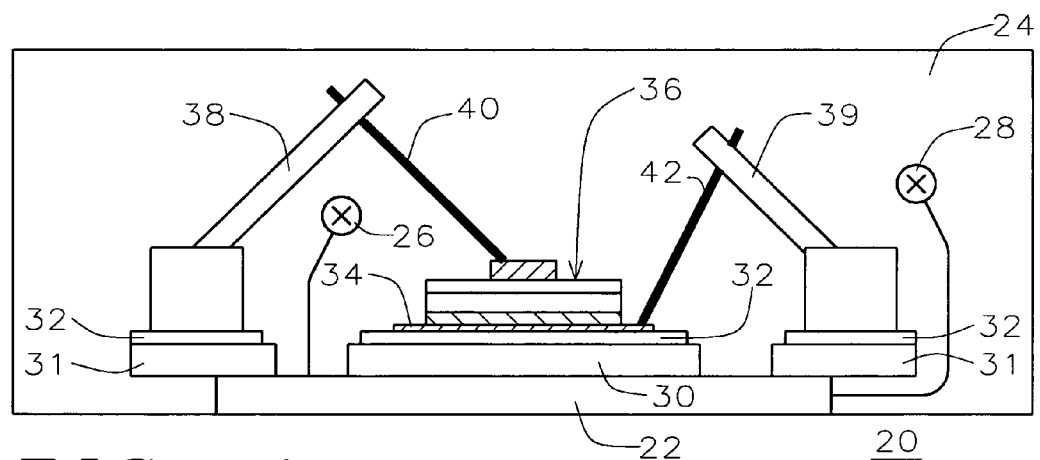

FIG. 4 illustrates a second embodiment of the novel ZBTSC apparatus of the present invention. First cold finger 30 holds the sample 36, mounted as in the first embodiment over an insulator layer 32 by means of a conductive adhesive 34. The probe holder 39 can be mounted on a second cold finger 31. There may be another second cold finger 31 for a second probe holder 39, as shown, if two probes 40 and 42 are to be used. During the temperature scanning in ZBTSC measurement, there are two sets of feedback temperature controls 26 and 28 (from the first and second cold fingers 30 and 31, respectively). The two sets of feedback temperature controls are programmed such that the two cold fingers will always have the same temperature.

Using the novel ZBTSC apparatus of the present invention, in either of the two preferred embodiments or any other embodiments such that the probe holders are mounted on a cold finger to achieve the same temperature as that of the sample, results in a zero temperature gradient across the sample. Elimination of the temperature difference between the probe holder and the cold finger holding the sample eliminates the parasitic current shown in FIG. 2. Thus, the process of the present invention using the novel ZBTSC apparatus results in an improved method of characterizing defects in semiconductors or insulators.

While the invention has been particularly shown and described with reference to the preferred embodiments thereof, it will be understood by those skilled in the art that various changes in form and details may be made without departing from the spirit and scope of the invention.

What is claimed is:

1. A zero-bias thermally stimulated current apparatus comprising:
   a cold finger on a cryostat on which a sample is to be mounted;
   a probe holder attached to said cold finger;
   a probe attached to said probe holder; and
   a feedback temperature control whereby said probe and said cold finger are kept at the same temperature.

2. The zero-bias thermally stimulated current apparatus according to claim 1 further comprising:
   a second probe holder attached to said cold finger; and
   a second probe attached to said second probe holder.

3. A method of characterizing defects in a sample using said zero-bias thermally stimulated current apparatus of claim 1 comprising:
   mounting said sample on said cold finger;
   optically or electrically exciting said sample at a first temperature to fill up defect traps in said sample with carriers;
   heating said sample to a second temperature higher than said first temperature wherein said heating is a linear function with respect to time; and
   characterizing said defects by measuring current due to emission of said carriers from said defect traps as a function of temperature wherein no bias current is applied to said sample and wherein said measuring is performed by said probe.

4. The method according to claim 3 wherein said sample comprises semiconductor devices comprising semiconductor or insulator layers.

5. The method according to claim 3 wherein said first temperature is between about −197° C. and 0° C.

6. The method according to claim 3 wherein said second temperature is at or above room temperature and higher than said first temperature.

7. The method according to claim 3 wherein said probe contacts a top portion of said sample and wherein a second probe contacts a bottom portion of said sample and wherein said second probe is attached to a second probe holder mounted on said cold finger.

8. The zero-bias thermally stimulated current apparatus according to claim 1 wherein said cold finger is made of copper.

9. The zero-bias thermally stimulated current apparatus according to claim 1 wherein said feedback temperature control comprises a cooling element, a heater and a temperature sensor and wherein said feedback temperature control is attached to said cold finger.

10. The zero-bias thermally stimulated current apparatus according to claim 1 wherein said cryostat is inside a vacuum chamber.

11. The zero-bias thermally stimulated current apparatus according to claim 1 further comprising an insulator overlying said cold finger wherein said insulator comprises mica.

12. The zero-bias thermally stimulated current apparatus according to claim 1 wherein said sample is mounted onto said cold finger by means of a conductive adhesive.

13. The zero-bias thermally stimulated current apparatus according to claim 12 wherein said conductive adhesive comprises silver paint.

* * * * *